United States Patent [19]

Muggli et al.

[11] Patent Number: 4,720,467

[45] Date of Patent: Jan. 19, 1988

[54] METHOD OF FORMING A CAPACITOR-TRANSISTOR INTEGRATED CIRCUIT

[75] Inventors: Raymond A. Muggli, San Jose; Terence P. McCaffrey, Cupertino, both of Calif.

[73] Assignee: International Business Machines Corporation, Armonk, N.Y.

[21] Appl. No.: 913,832

[22] Filed: Sep. 29, 1986

[51] Int. Cl.$^4$ .................... H01L 21/38; H01L 29/94
[52] U.S. Cl. ........................ 437/52; 437/919
[58] Field of Search ............ 437/52, 919; 357/42, 357/14

[56] References Cited

U.S. PATENT DOCUMENTS

| | | | |
|---|---|---|---|
| 4,216,451 | 8/1980 | Nishimura et al. | 334/15 |
| 4,384,218 | 5/1983 | Shimotori et al. | 307/304 |
| 4,413,401 | 11/1983 | Klein et al. | 437/919 |
| 4,507,159 | 3/1985 | Erb | 437/919 |
| 4,536,947 | 8/1985 | Bohr et al. | 29/576 |
| 4,559,548 | 12/1985 | Iizuka et al. | 357/23.6 |
| 4,570,331 | 2/1986 | Eaton, Jr. et al. | 29/576 B |

Primary Examiner—George T. Ozaki
Attorney, Agent, or Firm—F. David LaRiviere; Henry E. Otto, Jr.

[57] ABSTRACT

Process and structure for semiconductor chip capacitors having high capacitance with variations in applied voltage without adding process steps to fabricate same.

7 Claims, 5 Drawing Figures

METHOD OF FORMING A CAPACITOR-TRANSISTOR INTEGRATED CIRCUIT

BACKGROUND OF THE INVENTION

The present invention relates to process and structure for capacitor elements on integrated circuit chips. In particular, the present invention provides capacitor elements having high capacitance per unit area and stable capacitance with variations in applied voltage which are compatible with CMOS chips. No additional process steps are required to fabricate capacitor elements according to the present invention.

In integrated circuit design, on-chip capacitors are frequently required. Such capacitors, to be optionally useful, must have high capacitance per unit area and a capacitance value that does not change with variation in the voltage applied to the capacitor. Where such characteristics have been produced, additional processing steps are usually required.

A conventional CMOS capacitive element 10 is shown in FIG. 1. Such elements are typically located apart from other elements on the chip. Furthermore, at least one additional process step is required to form oxide layer 13 over N+ diffused region 12 in N-well 11 to insulate electrode 14 from electrode 15.

Other prior art semiconductor chip capacitors which are formed without additional process steps usually have at least one semiconductor plate. See for example, U.S. Pat. No. 4,384,218, which describes a prior art MOS capacitor having only one polysilicon plate while the other plate comprises semiconductor regions in the substrate. Similarly, see also U.S. Pat. Nos. 4,216,451, 4,536,947, 4,559,548 and 4,570,331. Such capacitors are notorious for instability of capacitance with variations in applied voltage.

SUMMARY OF THE INVENTION

A capacitive element formed in accordance with the present invention provides high capacitance per unit area, stable capacitance value with changes in applied voltage, and requires no additional process steps over the number required for processing other components on the chip. High capacitance per unit area is achieved by using the same oxidation layer for the dielectric as is used for the gate of field effect transistors (FET's). Stability of capacitance value is achieved by incorporating a back plate comprising the same type of diffusion region, formed at the same time, that is used for the source and drain of transistors.

DESCRIPTION OF THE PREFERRED EMBODIMENT

Figure 1:
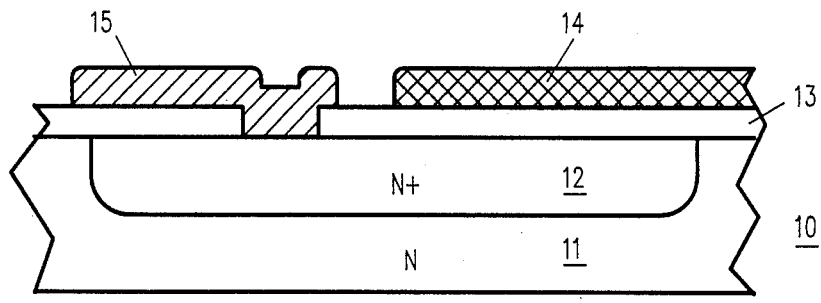
FIG. 1 is a cross-sectional view of prior art capacitive elements used on typical semiconductor chips.

Capacitors 20 comprise N+ diffused regions 23, silicon dioxide layer portions 24, and polysilicon layer portions 26a and 26b. Regions 23 form part of one of the capacitor plates to which electrical contact is made via metalization layer portions 25. The polysilicon layer portions 26a and 26b form the other plate to which bias voltage is applied directly. Silicon dioxide layer 24 is used as the dielectric between capacitor plates formed by regions 23 and polysilicon layers 26a and 26b which yields high capacitance per unit area.

Capacitor elements 20 are formed in N-well 22 on P-substrate 21 using well-known CMOS processing technology. N+ diffused regions 23 are formed during the same diffusion step that forms the N-channel FET source and drain diffusion. Dielectric 24 is constructed during the same diffusion step which forms the FET gate oxidation layer for the same FET's which may be located elsewhere on the same substrate. Thus, no additional processing steps are required to form capacitors 20.

Figure 2A:
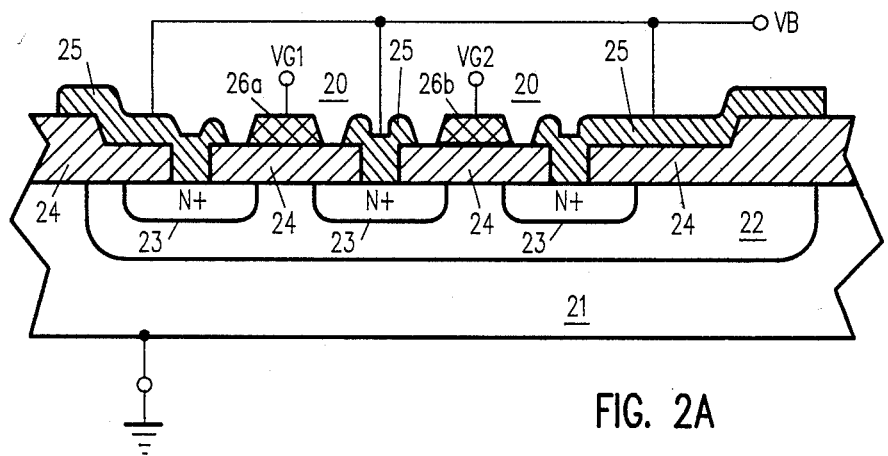
FIG. 2A is a cross-sectional view of capacitive elements for use on semiconductor chips constructed in accordance with the principles of the present invention.
Figure 2B:
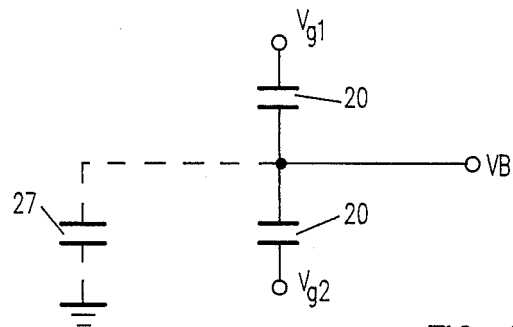
FIG. 2B is a circuit diagram of the capacitive elements of FIG. 2A.

Biasing capacitors 20 of FIG. 2A is shown in FIG. 2B. While two capacitors 20 are shown, the structure and process steps are the same for a single capacitor. It should be noted also that parasitic capacitor 27 arises from the junction of N-well 22 and substrate 21.

With continuing reference to FIG. 2B, the substrate is biased at ground or at the most negative voltage of the circuit in which the capacitor is used. By keeping $V_{g1}$ and $V_{g2}$ greater than $V_b$, inversion of the silicon surface under capacitor dielectric layer portions 24 is precluded. Moreover, $V_b$ also provides equipotential biasing of layer portions 24, the effect of which is described in more detail elsewhere in this specification.

Figure 3A:
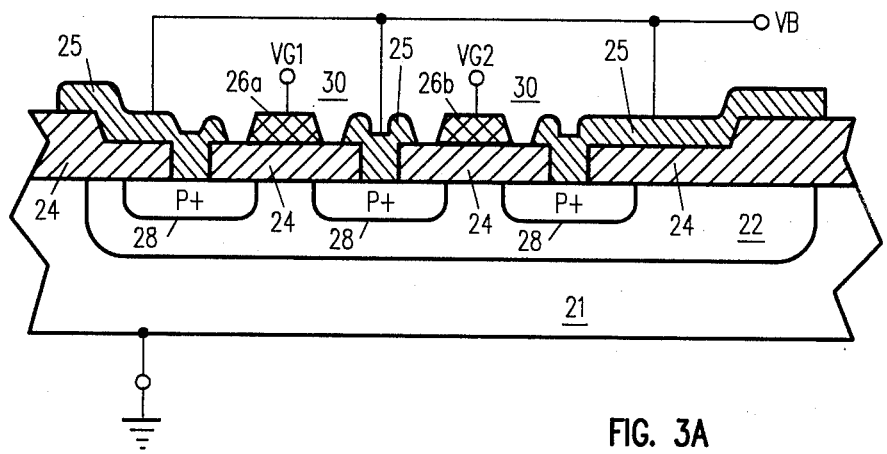
FIG. 3A is a cross-sectional view of a second embodiment of capacitive elements constructed according to the principles of the present invention.

Referring now to FIG. 3A, a similar structure is shown for capacitors 30. In this configuration, P+ diffusion regions 28 are used in lieu of N+ diffusion regions 23 to form part of one of the plates of capacitors 30. The dielectric layer, second capacitor plate and electrical contact connection are the same structure and require the same process steps as those formed in the configuration of FIG. 2A. P+ diffusion regions 28 are formed during the same process steps which forms the P-channel FET source and drain diffusions.

Figure 3B:
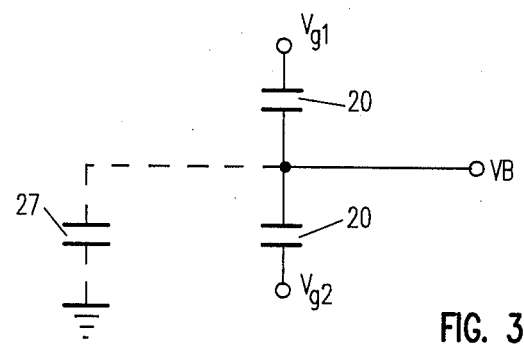
FIG. 3B is a circuit diagram of the capacitive elements of FIG. 3A.

Referring finally to FIG. 3B, for the structure of FIG. 3A to function as a good capcitor, the silicon region under capacitor dielectric layer 24 must be inverted to P-type. For a typical application, the useful range of bias voltage, $V_b$ is given by $$V_b - V_t \geq V_{g1} \text{ or } V_{g2}$$

where the threshold voltage, $V_t$, is approximately $-0.8$ volts.

As noted elsewhere in this specification, $V_b$ provides equipotential voltage level to dielectric layers 24 via the capacitor plates formed by regions 23 in the two-capacitor configuration of FIG. 2A. In this biasing configuration therefore, there exists an equivalent capacitor comprising two plates 26a and 26b dielectrically separated by two dielectric layers 26a biased at the same voltage regions 23. While parasitic capacitor 27 shown in FIG. 2B cannot be ignored, it can be minimized or modelled to provide the useful equivalent metal-oxide-metal capacitor described above.

We claim:

1. In an integrated circuit, the method of forming a capacitor structure at the same time as structure for transistors, each having a source, drain and gate, said method comprising the steps of:
   providing a substrate;
   forming a well of a first conductivity type in the substrate;
   forming a high concentration impurity region of a second conductivity type in the well to form a first capacitor plate at the same time that impurity regions for the source and drain of the transistors are formed;
   forming an oxide layer having access holes over the first-mentioned impurity region to form the capacitor dielectric at the same time that an oxide layer for the gates of the transistors is formed;
   forming a layer of high conductivity material over the first-mentioned oxide layer to form a second capacitor plate; and
   forming a layer of metalization over the first-mentioned oxide layer which is connected to the high concentration impurity region via the access holes to provide electrical connection to the first capacitor plate.

2. The method as in claim 1 wherein the first and second conductivity types are the same.

3. The method as in claim 2 wherein the conductivity type of the substrate is different from the first and second conductivity types.

4. The method as in claim 2 wherein:
   the first and second conductivity types are N type;
   the oxide layer is silicon dioxide; and the high conductivity material is polysilicon.

5. The method as in claim 1 wherein the first and second conductivity types are different.

6. The method as in claim 5 wherein the substrate is the same conductivity type as the second conductivity type.

7. The method as in claim 6 wherein the second conductivity type is P type.

* * * * *